US007544462B2

(12) United States Patent
Levanon et al.

(10) Patent No.: US 7,544,462 B2
(45) Date of Patent: Jun. 9, 2009

(54) RADIATION-SENSITIVE COMPOSITION AND ELEMENTS WITH BASIC DEVELOPMENT ENHANCERS

(75) Inventors: Moshe Levanon, Ness-Ziona (IL); Larisa Postel, Ashdod (IL); Marina Rubin, Petah-Tikva (IL); Tanya Kurtser, Petach Tiqwa (IL)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/677,599

(22) Filed: Feb. 22, 2007

(65) Prior Publication Data

US 2008/0206678 A1 Aug. 28, 2008

(51) Int. Cl.
*G03F 7/004* (2006.01)

(52) U.S. Cl. .................... 430/270.1; 430/302; 430/919; 430/920

(58) Field of Classification Search ................. 430/191, 430/192, 193, 270.1, 302, 919, 920
See application file for complete search history.

(56) References Cited

U.S. PATENT DOCUMENTS

| | | | | |
|---|---|---|---|---|
| 3,864,133 | A * | 2/1975 | Hisamatsu et al. | 522/96 |
| 4,374,193 | A | 2/1983 | Moriya et al. | 430/149 |
| 4,544,627 | A * | 10/1985 | Takahashi et al. | 430/325 |
| 4,696,891 | A * | 9/1987 | Guzzi | 430/325 |
| 5,716,753 | A | 2/1998 | Yoshimoto et al. | |
| 6,255,033 | B1 | 7/2001 | Levanon et al. | 430/275.1 |
| 6,541,181 | B1 | 4/2003 | Levanon et al. | 430/275.1 |
| 6,596,457 | B1 | 7/2003 | Hidaka et al. | 430/270.1 |
| 7,279,263 | B2 * | 10/2007 | Goodin | 430/157 |
| 2005/0003296 | A1 | 1/2005 | Memetea et al. | 430/270.1 |
| 2005/0214677 | A1 | 9/2005 | Nagashima | 430/270.1 |
| 2005/0214678 | A1 | 9/2005 | Nagashima | 430/270.1 |

FOREIGN PATENT DOCUMENTS

| | | |
|---|---|---|
| EP | 0 823 327 | 2/1998 |
| EP | 1 091 253 | 3/2005 |
| EP | 1 627 732 | 2/2006 |
| GB | 1245924 | 9/1971 |
| WO | 99/08157 | 2/1999 |
| WO | 99/11458 | 3/1999 |
| WO | 01/09682 | 2/2001 |
| WO | 02/066252 | 8/2002 |
| WO | 2004/081662 | 9/2004 |
| WO | 2007/001802 | 1/2007 |

* cited by examiner

*Primary Examiner*—John S Chu
(74) *Attorney, Agent, or Firm*—J. Lanny Tucker

(57) ABSTRACT

Radiation-sensitive compositions can be used to prepare positive-working imageable elements useful for example to make lithographic printing plates. The compositions include an aqueous alkaline solvent soluble polymeric binder that includes a phenolic resin (such as a novolak) or a poly(vinyl acetal). The compositions also include a developability-enhancing composition comprising one or more basic nitrogen-containing organic compounds. The radiation-sensitive composition can be coated as an imageable layer that further includes a radiation absorbing compound that is, for example, sensitive to infrared radiation.

22 Claims, No Drawings

RADIATION-SENSITIVE COMPOSITION AND ELEMENTS WITH BASIC DEVELOPMENT ENHANCERS

FIELD OF THE INVENTION

This invention relates to radiation-sensitive compositions and positive-working imageable elements prepared using these compositions. It also relates to methods of imaging these elements to provide imaged elements that can be used as lithographic printing plates.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, the ink receptive regions accept the ink and repel the water. The ink is then transferred to the surface of suitable materials upon which the image is to be reproduced. In some instances, the ink can be first transferred to an intermediate blanket that in turn is used to transfer the ink to the surface of the materials upon which the image is to be reproduced.

Imageable elements useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer, revealing the underlying hydrophilic surface of the substrate. If the exposed regions are removed, the element is considered as positive-working. Conversely, if the non-exposed regions are removed, the element is considered as negative-working. In each instance, the regions of the imageable layer(s) that remain are ink-receptive, and the regions of the hydrophilic surface revealed by the developing process accept water or aqueous solutions (typically a fountain solution), and repel ink.

Similarly, positive-working compositions can be used to form resist patterns in printed circuit board (PCB) production, thick-and-thin film circuits, resistors, capacitors, and inductors, multichip devices, integrated circuits, and active semiconductive devices.

"Laser direct imaging" methods (LDI) have been known that directly form an offset printing plate or printing circuit board using digital data from a computer, and provide numerous advantages over the previous processes using masking photographic films. There has been considerable development in this field from more efficient lasers, improved imageable compositions and components thereof.

Thermally sensitive imageable elements can be classified as those that undergo chemical transformation(s) in response to, exposure to, or adsorption of, suitable amounts of thermal energy. The nature of thermally induced chemical transformation may be to ablate the imageable composition in the element, or to change its solubility in a particular developer, or to change the tackiness or hydrophilicity or hydrophobicity of the surface layer of the thermally sensitive layer. As such, thermal imaging can be used to expose predetermined regions of an imageable layer that can serve as a lithographic printing surface or resist pattern in PCB production.

Positive-working imageable compositions containing novolak or other phenolic polymeric binders and diazoquinone imaging components have been prevalent in the lithographic printing plate and photoresist industries for many years. Imageable compositions based on various phenolic resins and infrared radiation absorbing compounds are also well known.

A wide range of thermally-imageable compositions useful as thermographic recording materials are described in GB Patent Publication 1,245,924 (Brinckman). This publication describes increasing the solubility of any given area of the imageable layer in a given solvent by heating the imageable layer by indirect exposure to a short-duration, high intensity visible light or infrared radiation. This radiation can be transmitted or reflected from the background areas of a graphic original located in contact with the recording material. The publication describes various mechanisms and developing materials and novolak resins are included among the aqueous developable compositions that can also include radiation absorbing compounds such as carbon black or C.I. Pigment Blue 27.

Other thermally imageable, single- or multi-layer elements are described for example, in WO 97/039894 (Hoare et al.), WO 98/042507 (West et al.), WO 99/011458 (Ngueng et al.), U.S. Pat. No. 5,840,467 (Katatani), U.S. Pat. No. 6,060,217 (Ngueng et al.), U.S. Pat. No. 6,060,218 (Van Damme et al.), U.S. Pat. No. 6,110,646 (Urano et al.), U.S. Pat. No. 6,117,623 (Kawauchi), U.S. Pat. No. 6,143,464 (Kawauchi), U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), U.S. Patent Application Publications 2002/0081522 (Miyake et al.) and 2004/0067432 A1 (Kitson et al.).

Problem to be Solved

The industry has focused on the need to diminish the solubility of the exposed regions of phenolic binders (dissolution inhibitors) in the imageable layers before exposure and to enhance their solubility after exposure to suitable thermal energy (dissolution enhancers). Several materials capable of increasing the sensitivity of positive-working compositions have been described. All of the described previous dissolution enhancers are of an acidic nature, and include sulfonic acids, sulfinic acids, alkylsulfuric acids, phosphonic acids, phosphinic acids, phosphoric acid esters, carboxylic acids, phenols, sulfonamides and sulfonimides.

These organic acids and cyclic acid anhydrides may be used alone, but they are preferably used in any combination of at least two of them. It is also preferable to use at least one cyclic acid anhydride in addition to at least two organic acids since such a combination would permit the achievement or further improved developing latitude and printing durability.

WO 2004/081662 (Memetea et al.) describes the use of various developability-enhancing compounds of acidic nature with phenolic polymers or poly(vinyl acetals) to enhance the sensitivity of positive-working compositions and elements so that required imaging energy is reduced. Some of the particularly useful poly(vinyl acetals) for such compositions and elements are described in U.S. Pat. Nos. 6,255,033 (Levanon et al.) and 6,541,181 (Levanon et al.).

While the compositions described in the noted Memetea and Levanon et al. publications have provided important advances in the art, there is a continuing need to improve the sensitivity of positive-working compositions and elements even more, and particular in response to infrared radiation.

SUMMARY OF THE INVENTION

The present invention solves the noted problem with a novel composition and positive-working element. Thus, the present invention provides a radiation-sensitive composition comprising:

a. an aqueous alkaline developer soluble polymeric binder that comprises a phenolic resin or a poly(vinyl acetal), and b. a developability-enhancing material comprising a basic nitrogen-containing organic compound.

This invention also provides a positive-working imageable element comprising a substrate and having thereon an imageable layer comprising an aqueous alkaline developer soluble polymeric binder that comprises a phenolic resin or a poly (vinyl acetal), a developability-enhancing material comprising a basic nitrogen-containing organic compound, and a radiation absorbing compound.

Further, this invention provides a method of making a printing plate comprising:

A) imagewise exposing the positive-working imageable element of this invention to provide exposed and non-exposed regions, and B) developing the imagewise exposed element to remove only the exposed regions.

The positive-working compositions and imageable elements of this invention exhibit improved sensitivity to imaging radiation. In addition, it was found that the imageable elements of this invention provide extremely good press performance when not baked after development. However, when they are baked after development, they provide extremely long run length in presence of any aggressive press chemicals.

These advantages have been achieved by using a developability-enhancing composition containing a particular class of basic nitrogen-containing organic compounds in combination with the phenolic resin or poly(vinyl acetal) polymeric binder. The useful nitrogen-containing organic compounds are "basic", meaning that when added to water, it would form a solution having a pH greater than 7. In some embodiments, they have a boiling point greater than 300° C. and an evaporation rate less than 0.01 relative to n-butyl acetate. In some embodiments, such compounds also are liquids at room temperature (that is, about 25° C.).

DETAILED DESCRIPTION OF THE INVENTION

Definitions

Unless the context otherwise indicates, when used herein, the terms "radiation-sensitive composition" and "imageable element" are meant to be references to embodiments of the present invention.

In addition, unless the context indicates otherwise, the various components described herein such as "primary polymeric binder", "phenolic resin", "poly(vinyl acetal)", "radiation absorbing compound", and "basic nitrogen-containing organic compound", also refer to mixtures of each component. Thus, the use of the articles "a", "an", and "the" is not necessarily meant to refer to only a single component.

Unless otherwise indicated, percentages refer to percents by weight.

The term "single-layer imageable element" refers to an imageable element having only one layer for imaging, but as pointed out in more detail below, such elements may also include one or more layers under or over (such as a topcoat) the imageable layer to provide various properties.

As used herein, the term "radiation absorbing compound" refers to compounds that are sensitive to certain wavelengths of radiation and can convert photons into heat within the layer in which they are disposed. These compounds may also be known as "photothermal conversion materials", "sensitizers", or "light to heat converters".

For clarification of definition of any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any different definitions set forth herein should be regarded as controlling.

The term "polymer" (for example, phenolic resin and polyvinyl acetal) refers to high and low molecular weight polymers including oligomers and includes both homopolymers and copolymers.

The term "copolymer" refers to polymers that are derived from two or more different monomers, or have two or more different recurring units, even if derived from the same monomer.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction of some other means.

Uses

The radiation-sensitive compositions of this invention can be used to form resist patterns in printed circuit board (PCB) production, thick-and-thin film circuits, resistors, capacitors, and inductors, multi-chip devices, integrated circuits, and active semi-conductive devices. In addition, they can be used to provide positive-working imageable elements that in turn can be used to provide lithographic printing plates. Other uses would be readily apparent to one skilled in the art.

Radiation-Sensitive Compositions

The radiation-sensitive compositions include one or more aqueous alkaline solvent (developer) soluble polymeric binders as the primary polymeric binders. These primary polymeric binders include various phenolic resins and poly(vinyl acetals). The weight average molecular weight (Mw) of the polymers useful as primary binders is generally at least 5,000 and can be up to 300,000, and typically it is from about 20,000 to about 50,000, as measured using standard procedures. The optimal Mw may vary with the specific class of polymer and its use.

The primary polymeric binders may be the only binders in the radiation-sensitive composition (or imageable layer) but more generally, they comprise at least 10 weight %, and more typically at least 50 weight % and up to 90 weight %, based on the dry weight of all polymeric binders. In some embodiments, the amount of primary polymeric binders may be from about 55 to about 80 weight %, based on the dry weight of all polymeric binders.

Some useful poly(vinyl acetals) are described for example, in U.S. Pat. Nos. 6,255,033 and 6,541,181, and WO 2004/081662, all noted above and incorporated herein by reference. The same or similar poly(vinyl acetals) are described by Structures (I) and (II) containing structural units (a) through (e) in EP 1,627,732 (Hatanaka et al.) and in US Published Patent Applications 2005/0214677 (Nagashima) and 2005/0214678 (Nagashima), all incorporated herein by reference with respect to the poly(vinyl acetals) described therein.

Structures (I) and (II) in EP 1,627,732 (noted above) are not to be confused with Structures (I) and (II) defined below. Some useful poly(vinyl acetals) comprise recurring units other than acetal-containing recurring units as long as least 50 mol % (from about 50 mol % to about 75 mol %, and more typically at least 60 mol %) of the recurring units are acetal-containing recurring units. In such polymeric binders, the non-acetal-containing recurring units may also have the same or different pendant phenolic groups, or they may be recurring units having no pendant phenolic groups, or they may comprise both types of recurring units. For example, the poly(vinyl acetal) could also include recurring units comprising an itaconic acid or crotonic acid group. In addition, if there are recurring units comprising pendant phenolic groups, those recurring units can have different pendant phenolic groups [for example, a poly(vinyl acetal) could have acetal-containing recurring units, and two or more different types of recurring units with different pendant phenolic groups]. In still other embodiments, a small molar amount (less than 20 mol %) of the acetal groups in a poly(vinyl acetal) can be reacted with a cyclic anhydride or isocyanate compound, such as toluene sulfonyl isocyanate).

Useful poly(vinyl acetals) can also comprise recurring units represented by the following Structure (PVAc):

(PVAc)

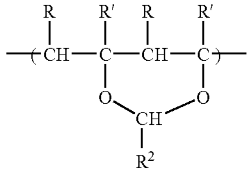

In Structure (PVAc), R and R' are independently hydrogen, or a substituted or unsubstituted linear or branched alkyl group having 1 to 6 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl and iso-hexyl groups), or substituted or unsubstituted cycloalkyl ring having 3 to 6 carbon atoms in the ring (such as cyclopropyl, cyclobutyl, cyclopentyl, methylcyclohexyl, and cyclohexyl groups), or a halo group (such as fluoro, chloro, bromo, or iodo). Typically, R and R' are independently hydrogen, or a substituted or unsubstituted methyl or chloro group, or for example, they are independently hydrogen or unsubstituted methyl.

$R^2$ is a substituted or unsubstituted phenol, a substituted or unsubstituted naphthol, or a substituted or unsubstituted anthracenol group. These phenol, naphthol and anthracenol groups can have optionally up to 3 additional substituents including additional hydroxy substituents, methoxy, alkoxy, aryloxy, thioaryloxy, halomethyl, trihalomethyl, halo, nitro, azo, thiohydroxy, thioalkoxy, cyano, amino, carboxy, ethenyl, carboxyalkyl, phenyl, alkyl, alkenyl, alkynyl, cycloalkyl, aryl, heteroaryl, and heteroalicyclic groups. For example, $R^2$ can be an unsubstituted phenol or naphthol group such as a 2-hydroxyphenyl or a hydroxynaphthyl group.

Thus, the poly(vinyl acetals) can have a variety of other recurring units besides those represented by Structure (PVAc), but generally, at least 50 mol % of the recurring units are the same or different recurring units represented by Structure (PVAc).

More specific useful poly(vinyl acetals) are represented by the following Structure (I) comprising the noted recurring units:

$$-(A)_m-(B)_n-(C)_p-(D)_q-(E)_r- \quad (I)$$

wherein:

A represents recurring units represented by the following Structure (Ia):

(Ia)

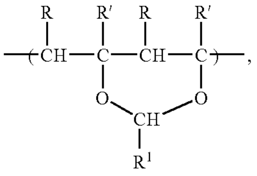

B represents recurring units represented by the following Structure (Ib):

(Ib)

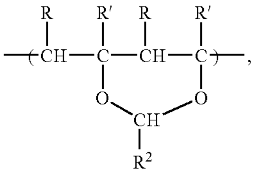

C represents recurring units represented by the following Structure (Ic):

(Ic)

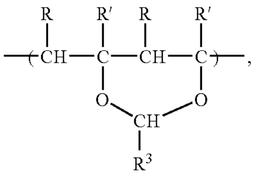

D represents recurring units represented by the following Structure (Id):

(Id)

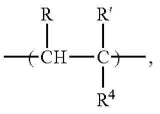

E represents recurring units represented by the following Structure (Ie):

(Ie)

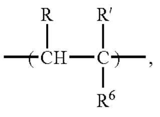

m is from about 5 to about 40 mol % (typically from about 15 to about 35 mol %), n is from about 10 to about 60 mol % (typically from about 20 to about 40 mol %), p can be from 0 to about 20 mol % (typically from 0 to about 10 mol %), q is from about 1 to about 20 mol % (typically from about 1 to about 15 mol %), and r is from about 5 to about 60 mol % (typically from about 15 to about 55 mol %).

R and R' are as described above for Structure (PVAc).

$R^1$ is a substituted or unsubstituted, linear or branched alkyl group having 1 to 12 carbon atoms (such as methyl, ethyl, n-propyl, iso-propyl, t-butyl, n-butyl, n-pentyl, n-hexyl, n-heptyl, n-octyl, n-nonyl, n-decyl, n-undecyl, n-dodecyl, methoxymethyl, chloromethyl, trichloromethyl, benzyl, cinnamoyl, iso-propyl, iso-butyl, s-butyl, t-butyl, iso-pentyl, neo-pentyl, 1-methylbutyl, and iso-hexyl groups), substituted or unsubstituted cycloalkyl ring having 3 to 6 carbon atoms in the ring (such as cyclopropyl, cyclobutyl, cyclopentyl, methylcyclohexyl, and cyclohexyl groups), or a substituted or unsubstituted aryl group having 6 or 10 carbon atoms in the aromatic ring (such as substituted or unsubstituted phenyl and naphthyl groups, including phenyl, xylyl, tolulyl, p-methoxyphenyl, 3-chlorophenyl, and naphthyl) other than a phenol or naphthol. Typically, $R^1$ is a substituted or unsubstituted alkyl group having 1 to 6 carbon atoms such as n-propyl.

$R^2$ is as defined above for Structure (PVAc).

$R^3$ is a substituted or unsubstituted alkynyl group having 2 to 4 carbon atoms (such as ethynyl groups), or a substituted or unsubstituted phenyl group (such as phenyl, 4-carboxyphenyl, carboxyalkyleneoxyphenyl, and carboxyalkylphenyl groups). Typically, $R^3$ is a carboxyalkylphenyl group, 4-carboxyphenyl, or carboxyalkyleneoxyphenyl group, or another carboxy-containing phenyl group.

$R^4$ is an —O—C(═O)—$R^5$ group wherein $R^5$ is a substituted or unsubstituted alkyl group having 1 to 12 carbon atoms or substituted or unsubstituted aryl group having 6 or 10 carbon atoms in the aromatic ring similarly to the definition of $R^1$ provided above. Typically, $R^5$ is a substituted or unsubstituted alkyl group having 1 to 6 carbon atoms such as an unsubstituted methyl group.

$R^6$ is a hydroxy group.

As indicated by the ratios of recurring units in Structure (I), the poly(vinyl acetals) may be at least tetramers depending upon the numbers of different recurring units present. For example, there may be multiple different types of recurring units from any of the defined classes of recurring units, of Structures (Ia) through (Ie). For example, a poly(vinyl acetal) of Structure (I) may have Structure (Ia) recurring units with different $R^1$ groups. Such multiplicity of recurring units can also be true for those represented by any of Structures (Ib) through (Ie).

A primary polymeric binder represented by Structure (I) may contain recurring units other than those defined by Structures (Ia), (Ib), (Ic), (Id), and (Ie), and such recurring units would be readily apparent to a skilled worker in the art. Thus, Structure (I) in its broadest sense is not limited to the defined recurring units, but in some embodiments, only the recurring units in Structure (I) are present.

Content of the primary polymeric binder in the radiation-sensitive composition that forms a radiation-sensitive layer is generally from about 10 to about 99% of the total dry weight, and typically from about 30 to about 95% of the total dry weight. Many embodiments would include the primary polymeric binder in an amount of from about 50 to about 90% of the total composition or layer dry weight.

The poly(vinyl acetals) described herein can be prepared using known starting materials and reaction conditions including those described in U.S. Pat. No. 6,541,181 (noted above).

For example, acetalization of the polyvinyl alcohols takes place according to known standard methods for example as described in U.S. Pat. No. 4,665,124 (Dhillon et al.), U.S. Pat. No. 4,940,646 (Pawlowski), U.S. Pat. No. 5,169,898 (Walls et al.), U.S. Pat. No. 5,700,619 (Dwars et al.), and U.S. Pat. No. 5,792,823 (Kim et al.), and in Japanese Kokai 09-328,519 (Yoshinaga).

This acetalization reaction generally requires addition of a strong inorganic or organic catalyst acid. Examples of catalyst acids are hydrochloric acid, sulfuric acid, phosphoric acid, and p-toluenesulfonic acid. Other strong acids are also useful such as perfluoroalkylsulfonic acid and other perfluoro-activated acids. The amount of acid should effectively allow protonation to occur, but will not significantly alter the final product by causing unwanted hydrolysis of the acetal groups. The reaction temperature of the acetalization depends on the kind of aldehyde as well as the desired level of substitution. It is between 0° C. and, if applicable, the boiling point of the solvent. Organic solvents as well as mixtures of water with organic solvents are used for the reaction. For example, suitable organic solvents are alcohols (such as methanol, ethanol, propanol, butanol, and glycol ether), cyclic ethers (such as 1,4-dioxane), and dipolar aprotic solvents (such as N,N-dimethylformamid, N-methylpyrrolidone or dimethyl sulfoxide). If acetalization is carried out in organic solvents or mixtures of organic solvents with water, the reaction product often remains in solution even if the starting polyvinyl alcohol was not completely dissolved. Incomplete dissolution of the starting polyvinyl alcohol in organic solvents is a disadvantage that may lead to irreproducible degree of conversion and different products. Water or mixtures of organic solvents with water should be used to achieve complete dissolution of polyvinyl alcohol and reproducible products as a result of acetalization. The sequence of the addition of the various acetalization agents is often of no importance and comparable finished products are obtained from different preparation sequences. To isolate the finished products as a solid, the polymer solution is introduced into a non-solvent under vigorous stirring, filtered off and dried. Water is especially suitable as a non-solvent for the polymers.

Unwanted hydrolysis of the acetal group achieved by acetalization with hydroxyl-substituted aromatic aldehydes takes place much easier than for the acetals built from aliphatic or not substituted aromatic aldehydes or from aldehydes containing carboxylic moieties at the same synthesis conditions. The presence of even a small amount of water in the reaction mixture leads to decreased degree of acetalization and incomplete conversion of the aromatic hydroxy aldehyde used. On the other hand, it was found that in the absence of water, the hydroxy-substituted aromatic aldehydes react with hydroxyl groups of alcohols immediately and with almost 100% conversion. So, the process of acetalization of polyvinyl alcohols by hydroxy-substituted aromatic aldehydes to achieve the desired polyvinyl acetals according can be carried out different from the procedures known in the art. The water can be removed from the reaction mixture during the synthesis by distillation under reduced pressure and replaced with an organic solvent. The remaining water may be removed by addition to the mixture an organic material readily reactive with water and as a result of the reaction producing volatile materials or inert compounds. These materials may be chosen from carbonates, orthoesters of carbonic or carboxylic acids, which easily react with water, silica-containing compounds, such as diethylcarbonate, trimethyl orthoformate, tetraethyl carbonate, and tetraethyl silicate. The addition of these materials to reaction mixture leads to 100% conversion of the used aldehydes.

Thus, the preparation of a useful poly(vinyl acetal) can begin with dissolving of the starting polyvinyl alcohol in DMSO at 80-90° C., then the solution is chilled to 60° C., and the acidic catalyst dissolved in an organic solvent is added. Then the solution of the aliphatic aldehyde in the same solvent is added to the solution, the solution is kept for 30 minutes at 60° C., and a solution of the aromatic aldehyde and/or carboxylic substituted aldehyde, or other aldehyde in the same solvent is added. Anisole is added to the reaction mixture, and the azeothropic mixture of water with the anisole is removed by distillation and is replaced by the organic solvent. At this stage, the conversion of the aromatic hydroxy aldehyde reaches 95-98%. The acid in the reaction mixture is neutralized and the mixture is blended with water to precipitate the polymer that is filtrated, washed with water, and dried. A second way to achieve 100% of conversion of the aromatic hydroxyaldehyde to benzal is to add the water removing organic material (for example, a carbonate or orthoformate) after addition of the aldehydes to the reaction mixture.

Various phenolic resins can also be used as primary polymeric binders in this invention, including novolak resins such as condensation polymers of phenol and formaldehyde, condensation polymers of m-cresol and formaldehyde, condensation polymers of p-cresol and formaldehyde, condensation polymers of m-/p-mixed cresol and formaldehyde, condensation polymers of phenol, cresol (m-, p-, or m-/p-mixture) and formaldehyde, and condensation copolymers of pyrogallol and acetone. Further, copolymers obtained by copolymerizing compound comprising phenol groups in the side chains can be used. Mixtures of such polymeric binders can also be used.

Novolak resins having a weight average molecular weight of at least 1500 and a number average molecular weight of at least 300 are useful. Generally, the weight average molecular weight is in the range of from about 3,000 to about 300,000, the number average molecular weight is from about 500 to about 250,000, and the degree of dispersion (weight average molecular weight/number average molecular weight) is in the range of from about 1.1 to about 10.

Certain mixtures of the primary polymeric binders described above can be used, including mixtures of one or more poly(vinyl acetals) and one or more phenolic resins. For example, mixtures of one or more poly(vinyl acetals) and one or more novolak or resol (or resole) resins (or both novolak and resol resins) can be used.

It may be useful to include a "secondary" polymeric binder with the one or more primary polymeric binders described above. In particular, such secondary polymeric binders may be useful in combination with a poly(vinyl acetal) as described above.

The type of the secondary polymeric binder that can be used together with the primary polymeric binder is not particularly restricted. In general, from a viewpoint of not diminishing the positive radiation-sensitivity of the imageable element, the secondary polymeric binder is generally an alkali-soluble polymer also.

Examples of secondary polymeric binders include the following classes of polymers having an acidic group in (1) through (5) shown below on a main chain and/or side chain (pendant group).

(1) sulfone amide (—$SO_2NH$—R), (2) substituted sulfonamido based acid group (hereinafter, referred to as active imido group) [such as —$SO_2NHCOR$, $SO_2NHSO_2R$, —$CONHSO_2R$], (3) carboxylic acid group (—$CO_2H$), (4) sulfonic acid group (—$SO_3H$), and (5) phosphoric acid group (—$OPO_3H_2$).

R in the above-mentioned groups (1)-(5) represents hydrogen or a hydrocarbon group.

Representative secondary polymeric binders having the group (1) sulfone amide group are for instance, polymers that are constituted of a minimum constituent unit as a main component derived from a compound having a sulfone amide group. Thus, examples of such a compound include a compound having, in a molecule thereof, at least one sulfone amide group in which at least one hydrogen atom is bound to a nitrogen atom and at least one polymerizable unsaturated group. Among these compounds are m-aminosulfonylphenyl methacrylate, N-(p-aminosulfonylphenyl)methacrylamide, and N-(p-aminosulfonylphenyl)acrylamide. Thus, a homopolymer or a copolymer of polymerizing monomers having a sulfoneamide group such as m-aminosulfonylphenyl methacrylate, N-(p-aminosulfonylphenyl) methacrylamide, or N-(p-aminosulfonylphenyl)acrylamide can be used.

Examples of secondary polymeric binders with group (2) activated imido group are polymers comprising recurring units derived from compounds having activated imido group as the main constituent component. Examples of such compounds include polymerizable unsaturated compounds having a moiety defined by the following structural formula.

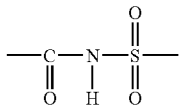

N-(p-toluenesulfonyl)methacrylamide and N-(p-toluenesulfonyl) acrylamide are examples of such polymerizable compounds.

Secondary polymeric binders having any of the groups (3) through (5) include those readily prepared by reacting ethylenically unsaturated polymerizable monomers having the desired acidic groups, or groups that can be converted to such acidic groups after polymerization.

Regarding the minimum constituent units having an acidic group that is selected from the (1) through (5), there is no need to use only one kind of acidic group in the polymer, and in some embodiments, it may be useful to have at least two kinds of acidic groups. Obviously, not every recurring unit in the secondary polymeric binder must have one of the acidic groups, but usually at least 10 mol % and typically at least 20 mol % comprise the recurring units having one of the noted acidic groups.

The secondary polymeric binder can have a weight average molecular weight of at least 2,000 and a number average molecular weight of at least 500. Typically, the weight average molecular weight is from about 5,000 to about 300,000, the number average molecular weight is from about 800 to about 250,000, and the degree of dispersion (weight average molecular weight/number average molecular weight) is from about 1.1 to about 10.

Mixtures of the secondary polymeric binders may be used with the one or more primary polymeric binders. The secondary polymeric binder(s) can be present in an amount of at least 1 weigh % and up to 50 weight %, and typically from about 5 to about 30 weight %, based on the dry weight of the total polymeric binders in the radiation-sensitive composition or imageable layer The radiation-sensitive composition further comprises a developability-enhancing composition that comprises one or more basic nitrogen-containing organic compounds. In most embodiments, each of these basic nitrogen-containing organic compounds has a boiling point greater than 300° C. and an evaporation rate <0.01 relative to n-butyl acetate. Most of the useful basic nitrogen-containing organic compounds are liquids at 25° C. Two or more of these compounds can be used in the same developability-enhancing composition if desired.

Representative basic nitrogen-containing organic compounds can be defined by the following structure (II):

$$(R^7)_s—N—[(CR^8R^9)_t—OH]_v \quad (II)$$

wherein t is 1 to 6, s is 0, 1, or 2, and v is 1 to 3, provided that the sum of s and v is 3.

When s is 1, $R^7$ is hydrogen, or a substituted or unsubstituted, branched or linear alkyl, linear or branched alkylamine group, cycloalkyl, heterocycloalkyl, carbocyclic aryl, arylamine, or heteroaryl group. Such groups can be unsubstituted or substituted with one or more of alkyl, haloalkyl, alkenyl, alkynyl, cycloalkyl, aryl, heteroaryl, heteroalicyclic, halo, nitro, azo, hydroxy, alkoxy, thiohydroxy, thioalkoxy, cyano, or amino groups.

When s is 2, the multiple $R^7$ groups can be the same or different substituted or unsubstituted groups as defined for $R^7$ above when s is 1. Alternatively, the two $R^7$ groups can be taken together with the nitrogen atom to form a substituted or unsubstituted heterocyclic ring. Substituents on this ring can be, for example, one or more alkyl, hydroxylalkyl, haloalkyl, alkenyl, alkynyl, cycloalkyl, aryl, arylamine, heteroaryl, heteroalicyclic, halo, nitro, azo, hydroxy, alkoxy, thiohydroxy, thioalkoxy, cyano and amino groups, which can be further substituted, if desired with one or more halo, nitro, azo, hydroxy, alkoxy, thiohydroxy, thioalkoxy, cyano or amino groups.

$R^8$ and $R^9$ can be the same or different hydrogen or substituted or unsubstituted, linear or branched alkyl groups. Representative substituents for the alkyl groups include one or more alkyl, haloalkyl, alkenyl, alkynyl, cycloalkyl, aryl, heteroaryl, heteroalicyclic, halo, nitro, azo, hydroxy, alkoxy, thiohydroxy, thioalkoxy, cyano and amino groups. Typically, t is 2 and $R^8$ and $R^9$ are both hydrogen.

Examples of basic nitrogen-containing organic compounds useful in the developability-enhancing compositions are N-(2-hydroxyethyl)-2-pyrrolidone, 1-(2-hydroxyethyl) piperazine, N-phenyldiethanolamine, triethanolamine, 2-[bis (2-hydroxyethyl)amino]-2-hydroxymethyl-1.3-propanediol, N,N,N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1,3,5-tris(2-hydroxyethyl)-s-triazine. Mixtures of two or more of these compounds are also useful. The basic nitrogen-containing organic compounds can be obtained from a number of commercial sources including BASF (Germany) and Aldrich Chemical Company (Milwaukee, Wis.).

The basic nitrogen-containing organic compound(s) is present in the radiation-sensitive composition (and imageable layer) in an amount of from about 1 to about 30 weight %, and typically from about 3 to about 15 weight %, based on the total solids of the radiation-sensitive composition or total dry weight of the imageable layer.

As noted above, these basic nitrogen-containing organic compounds may be used alone, but they are also useful in any combination of two or more.

It is also possible to use one or more of these basic nitrogen-containing organic compounds in combination with one or more acidic developability-enhancing compounds, such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides, since such a combination may permit further improved developing latitude and printing durability. Representative examples of such compounds are provided in [0030] to [0036] of U.S. Patent Application Publication 2005/0214677 (noted above) that is incorporated herein by reference with respect to these acid developability-enhancing compounds. Such compounds may be present in an amount of from about 0.1 to about 30 weight % based on the total dry weight of the radiation-sensitive composition or imageable layer.

In some instances, at least two of these acidic developability-enhancing compounds are used in combination with one or more (such as two) of the basic-nitrogen-containing organic compounds described above.

In the combination of basic and acidic compounds described above, the molar ratio of one or more basic nitrogen-containing organic compounds to one or more acidic developability-enhancing compounds is generally from about 0.1:1 to about 10:1 and more typically from about 0.5:1 to about 2:1.

The radiation-sensitive composition can include other optional addenda as described below for the imageable layer.

Imageable Elements

The imageable elements are positive-working imageable elements and the poly(vinyl acetals) or phenolic binders described herein are generally present as polymeric binders in a single imageable layer of these elements.

In general, the imageable elements are formed by suitable application of a formulation of the radiation-sensitive composition that contains one or more polymeric binders, the developability-enhancing composition, and typically a radiation absorbing compound (described below), as well as other optional addenda, to a suitable substrate to form an imageable layer. This substrate can be treated or coated in various ways as described below prior to application of the formulation. For example, the substrate can be treated to provide an "interlayer" for improved adhesion or hydrophilicity, and the imageable layer is applied over the interlayer.

The substrate generally has a hydrophilic surface, or a surface that is more hydrophilic than the applied imaging formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One substrate is composed of an aluminum support that may be coated or treated using techniques known in the art, including physical graining, electrochemical graining and chemical graining, followed by anodizing. The aluminum sheet can be mechanically or electrochemically grained and anodized using phosphoric acid or sulfuric acid and conventional procedures.

An optional interlayer may be formed by treatment of the aluminum support with, for example, a silicate, dextrine, calcium zirconium fluoride, hexafluorosilicic acid, phosphate/sodium fluoride, poly(vinyl phosphonic acid) (PVPA), vinyl phosphonic acid copolymer, poly(acrylic acid), or acrylic acid copolymer solution. The grained and anodized aluminum support can be treated with poly(acrylic acid) using known procedures to improve surface hydrophilicity.

The thickness of the substrate can be varied but should be sufficient to sustain the wear from printing and thin enough to wrap around a printing form. Some embodiments include a treated aluminum foil having a thickness of from about 100 μm to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

The imageable layer typically comprises one or more radiation absorbing compounds. While these compounds can be sensitive to any suitable energy form (for example, UV, visible, and IR radiation) from about 150 to about 1500 nm, they are typically sensitive to infrared radiation and thus, the radiation absorbing compounds are known as infrared radiation absorbing compounds ("IR absorbing compounds") that generally absorb radiation from about 600 to about 1400 nm and more likely, from about 700 to about 1200 nm. The imageable layer is generally the outermost layer in the imageable element.

Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable dyes are described for example, in U.S. Pat. Nos. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, such as two sulfonic acid groups and two indolenine groups. Useful IR-sensitive cyanine dyes of this type are described for example in U.S. Patent Application Publication 2005-0130059 (Tao).

A general description of a useful class of suitable cyanine dyes is shown by the formula in [0026] of WO 2004/101280 (Munnelly et al.).

In addition to low molecular weight IR-absorbing dyes, IR dye moieties bonded to polymers can be used. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above). The following IR dyes are representative of useful radiation absorbing compounds and are not meant to be limiting in any way:

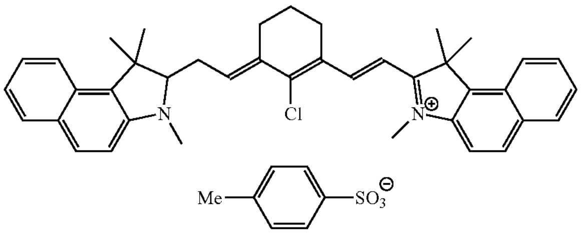

Same as above but with $C_3F_7CO_2^-$ as the anion.

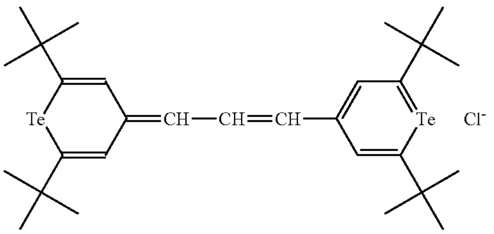

-continued
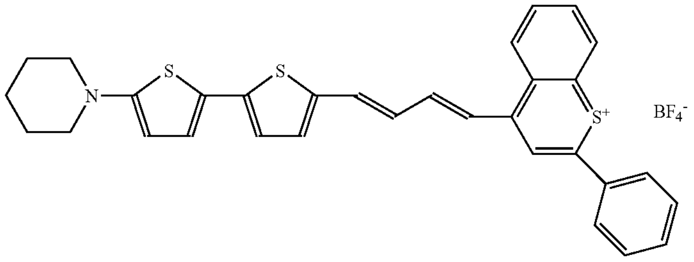
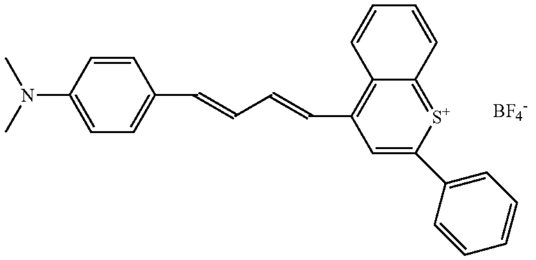
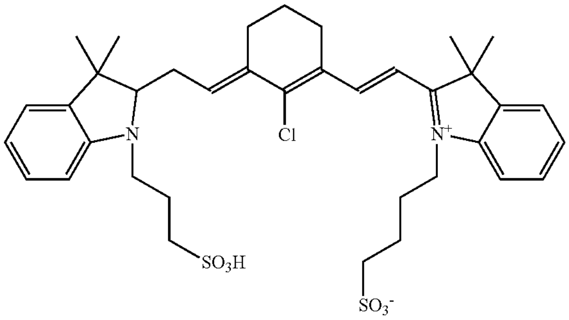
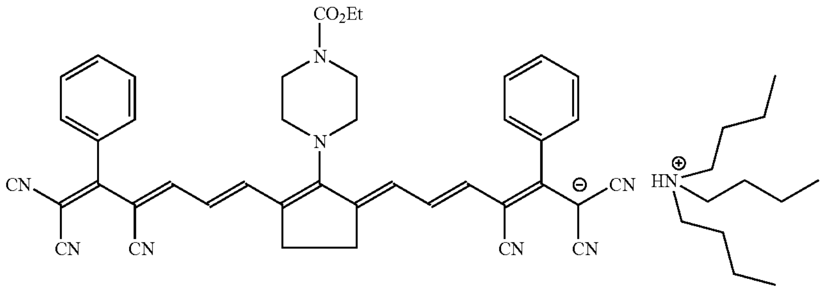
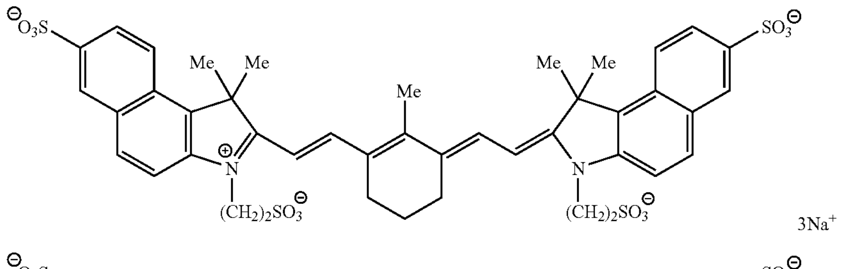
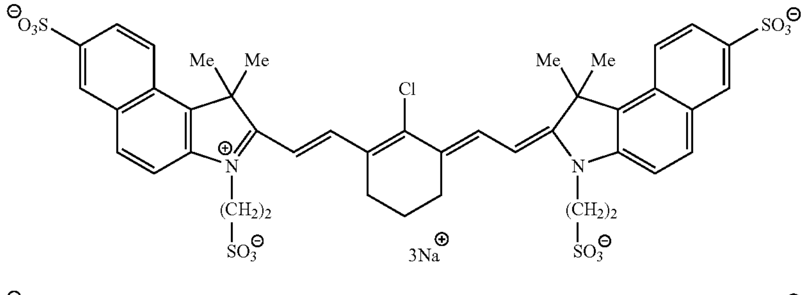
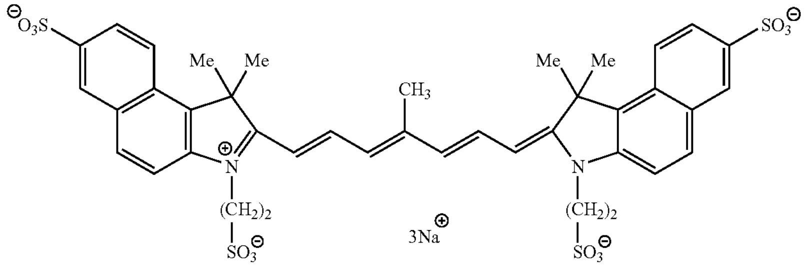

-continued

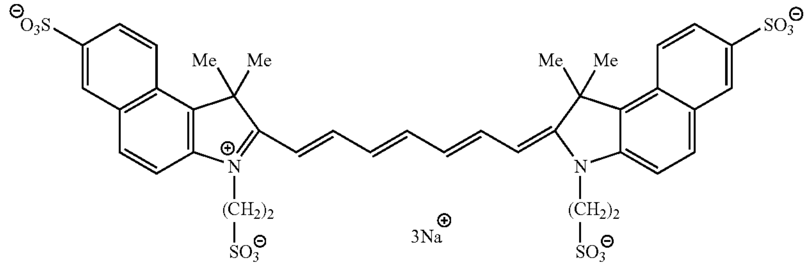

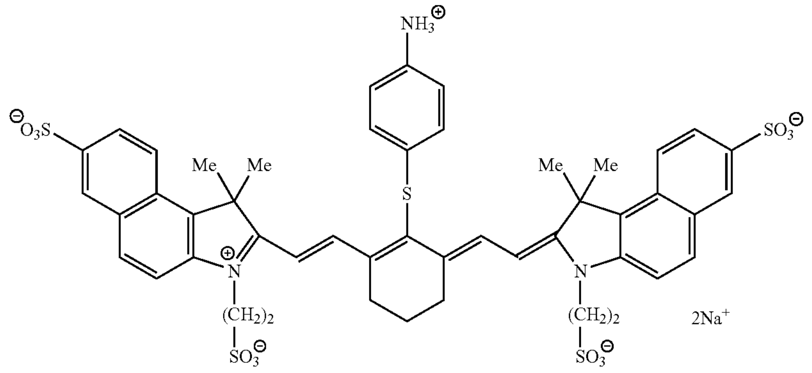

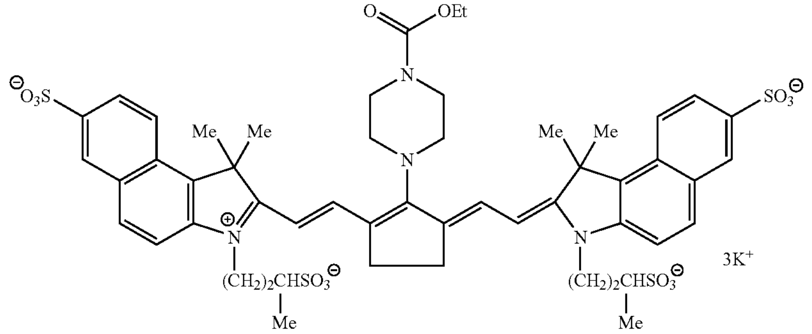

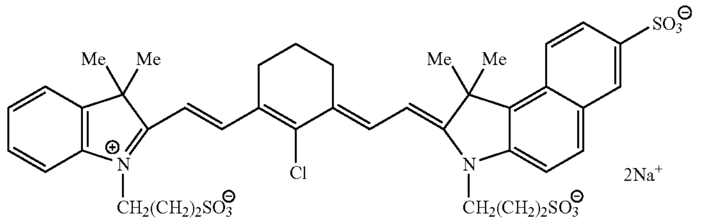

Useful IR absorbing compounds can also be pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and preferably the pigment particle size will be less than half the thickness of the imageable layer.

In the imageable elements, the radiation absorbing compound is generally present at a dry coverage of from about 0.1 to about 20 weight %, or it is an IR dye that is present in an amount of from about 0.5 to about 5 weight %. Alternatively, the amount can be defined by an absorbance in the range of from about 0.05 to about 3, or from about 0.1 to about 1.5, in the dry film as measured by reflectance UV-visible spectrophotometry. The particular amount needed for this purpose would be readily apparent to one skilled in the art, depending upon the specific compound used.

Alternatively, the radiation absorbing compounds may be included in a separate layer that is in thermal contact with the single imageable layer. Thus, during imaging, the action of the radiation absorbing compound in the separate layer can be transferred to the imageable layer without the compound originally being incorporated into it.

The imageable layer (and radiation-sensitive composition) can also include one or more additional compounds that act as colorant dyes. Colorant dyes that are soluble in an alkaline developer are useful. Useful polar groups for colorant dyes include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Useful colorant dyes include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can act as contrast dyes that distinguish the non-exposed (non-imaged) regions from the exposed (imaged) areas in the developed imageable element.

When a colorant dye is present in the imageable layer, its amount can vary widely, but generally it is present in an amount of from about 0.5 weight % to about 30 weight % (based on the total dry layer weight).

The imageable layer (and radiation-sensitive composition) can further include a variety of other additives including dispersing agents, humectants, biocides, plasticizers, nonionic or amphoteric surfactants for coatability or other properties (such as fluoropolymers), wear-resistant polymers (such as polyurethanes, polyesters, epoxy resins, polyamides, and acrylic resins), viscosity builders, fillers and extenders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts (for example, as described in US Patent Application Publication 2005/0214677, noted above).

The positive-working imageable element can be prepared by applying the imageable layer formulation over the surface of the substrate (and any other hydrophilic layers provided thereon) using conventional coating or lamination methods. Thus, the formulation can be applied by dispersing or dissolving the desired ingredients in a suitable coating solvent, and the resulting formulation is applied to the substrate using suitable equipment and procedures, such as spin coating, knife coating, gravure coating, die coating, slot coating, bar coating, wire rod coating, roller coating, or extrusion hopper coating. The formulation can also be applied by spraying onto a suitable support (such as an on-press printing cylinder).

The coating weight for the single imageable layer is from about 0.5 to about 2.5 $g/m^2$ or from about 1 to about 2 $g/m^2$.

The selection of solvents used to coat the layer formulation(s) depends upon the nature of the polymeric binders and other polymeric materials and non-polymeric components in the formulations. Generally, the imageable layer formulation is coated out of acetone, methyl ethyl ketone, or another ketone, tetrahydrofuran, 1-methoxy propan-2-ol (or 1-methoxy-2-propanol), N-methyl pyrrolidone, 1-methoxy-2-propyl acetate, γ-butyrolactone, and mixtures thereof using conditions and techniques well known in the art.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

A representative method for preparing positive-working single-layer imageable elements is described below in the examples.

After the imageable layer formulation is dried on the substrate (that is, the coating is self-supporting and dry to the touch), the element can be heat treated at from about 40 to about 90° C. (typically at from about 50 to about 70° C.) for at least 4 hours and typically at least 20 hours, or for at least 24 hours. The maximum heat treatment time can be as high as 96 hours, but the optimal time and temperature for the heat treatment can be readily determined by routine experimentation. Such heat treatments are described for example, in EP 823,327 (Nagasaka et al.) and EP 1,024,958 (McCullough et al.).

It may also be desirable that during the heat treatment, the imageable element is wrapped or encased in a water-impermeable sheet material to represent an effective barrier to moisture removal from the precursor. This sheet material can be sufficiently flexible to conform closely to the shape of the imageable element (or stack thereof) and is generally in close contact with the imageable element (or stack thereof). For example, the water-impermeable sheet material is sealed around the edges of the imageable element or stack thereof. Such water-impermeable sheet materials include polymeric films or metal foils that are sealed around the edges of imageable element or stack thereof.

Alternatively, heat treatment of the imageable element (or stack thereof) can be carried out in an environment in which relative humidity is controlled to from about 25% or from about 30%. Relative humidity is defined as the amount of water vapor present in air expressed as a percentage of the amount of water required for saturation at a given temperature.

Usually, at least 5 and up to 100 of the imageable elements are heat treated at the same time. More commonly, such a stack includes at least 500 imageable elements.

It may be difficult to achieve good wrapping at the top and bottom of such a stack using the water-impermeable sheet material and in such instances, it may be desirable to use "dummy" or reject elements in those regions of the stack. Thus, the heat-treated stack may include at least 100 useful imageable elements in combination with dummy or reject elements. These dummy or reject elements also serve to protect the useful elements from damage caused by the wrapping or sealing process.

Alternatively, the imageable element(s) may be heat treated in the form of a coil and then cut into individual elements at a later time. Such coils can include at least 1000 $m^2$ of imageable surface and more typically at least 3000 $m^2$ of imageable surface.

Adjacent coils or "spirals" or a coil, or strata of a stack may, if desired, be separated by interleaving materials, for example, papers or tissues that may be sized with plastics or resins (such as polythene).

Imaging and Development

The imageable elements of this invention can have any useful form including, but not limited to, printing plate precursors, printing cylinders, printing sleeves and printing tapes (including flexible printing webs). For example, the imageable members are lithographic printing plate precursors for forming lithographic printing plates.

Printing plate precursors can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

During use, the imageable elements are exposed to a suitable source of radiation such as UV, visible light, or infrared radiation, depending upon the radiation absorbing compound present in the radiation-sensitive composition, at a wavelength of from about 150 to about 1500 nm. For most embodiments, imaging is carried out using an infrared laser at a wavelength of from about 700 to about 1200 nm. The laser used to expose the imaging member can be a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. A useful imaging apparatus is available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

IR imaging speeds may be from about 30 to about 1500 $mJ/cm^2$, or from about 40 to about 200 $mJ/cm^2$.

While laser imaging is usually practiced, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Imaging is generally carried out using direct digital imaging. The image signals are stored as a bitmap data file on a computer. Such data files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable developer removes the exposed regions of the imageable layer and any layers underneath it, and exposing the hydrophilic surface of the substrate. Thus, such imageable elements are "positive-working" (for example, "positive-working" lithographic printing plate precursors).

Thus, development is carried out for a time sufficient to remove the imaged (exposed) regions of the imageable layer, but not long enough to remove the non-imaged (non-exposed) regions of the imageable layer. The imaged (exposed) regions of the imageable layer are described as being "soluble" or "removable" in the developer because they are removed, dissolved, or dispersed within the developer more readily than the non-imaged (non-exposed) regions of the imageable layer. The term "soluble" also means "dispersible".

The imaged elements are generally developed using conventional processing conditions. Both aqueous alkaline developers and organic solvent-containing developers can be used. In most embodiments of the method of this invention, the higher pH aqueous alkaline developers are used.

Aqueous alkaline developers generally have a pH of at least 7 and typically of at least 11. Useful alkaline aqueous developers include 3000 Developer, 9000 Developer, GOLDSTAR Developer, GOLDSTAR Plus Developer, GOLDSTAR Premium Developer, GREENSTAR Developer, ThermalPro Developer, PROTHERM Developer, MX1813 Developer, and MX1710 Developer (all available from Eastman Kodak Company, Norwalk, Conn.), and the "L-6" Developer (described below before the Examples). These compositions also generally include surfactants, chelating agents (such as salts of ethylenediaminetetraacetic acid), and alkaline components (such as inorganic metasilicates, organic metasilicates, hydroxides, and bicarbonates).

Organic solvent-containing developers are generally single-phase solutions of one or more organic solvents that are miscible with water. Useful organic solvents the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. Such developers can be neutral, alkaline, or slightly acidic in pH. Most of these developers are alkaline in pH, for example up to pH 11.

Representative organic solvent-containing developers include ND-1 Developer, "2 in 1" Developer, 955 Developer, and 956 Developer (all available from Eastman Kodak Company, Norwalk, Conn.).

Generally, the developer is applied to the imaged element by rubbing or wiping it with an applicator containing the developer. Alternatively, the imaged element can be brushed with the developer or the developer may be applied by spraying the element with sufficient force to remove the exposed regions. Still again, the imaged element can be immersed in the developer. In all instances, a developed image is produced in a lithographic printing plate having excellent resistance to press room chemicals.

Following development, the imaged element can be rinsed with water and dried in a suitable fashion. The dried element can also be treated with a conventional gumming solution (preferably gum arabic).

The imaged and developed element can also be baked in a post-exposure bake operation that can be carried out to increase run length of the resulting imaged element. Baking can be carried out, for example at from about 220° C. to about 240° C. for from about 2 to about 10 minutes, or at about 120° C. for 30 minutes.

Printing can be carried out by applying a lithographic ink and fountain solution to the printing surface of the imaged element. The ink is taken up by the non-imaged (non-exposed or non-removed) regions of the imageable layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are presented as a means to illustrate the practice of this invention but the invention is not intended to be limited thereby.

EXAMPLES

The following components were used in the preparation and use of the examples. Unless otherwise indicated, the components are available from Aldrich Chemical Company (Milwaukee, Wis.):

BF-03 represents a poly(vinyl alcohol), 98% hydrolyzed (Mw=15,000) that was obtained from Chang Chun Petrochemical Co. Ltd. (Taiwan).

BIS-TRIS represents 2,2-bis(hydroxymethyl)-2,2',2"-nitrilotriethanol.

Byk® 307 is a 25% (weight) solution of a modified dimethyl polysiloxane copolymer in xylene/methoxypropyl acetate that was obtained from BYK Chemie (Wallingford, Conn.).

Crystal Violet (C.I. 42555) is Basic Violet 3 ($\lambda_{max}$=588 nm).

DMSO represents dimethylsulfoxide.

HEP represents 1-(2-hydroxyethyl)-2-pyrrolidone.

HEPAPN represents 3-[(2-hydroxyethyl)phenylamino]-propionitrile.

L-6 represents a potassium silicate aqueous developer containing sodium salicylate (1%), D-sorbitol (1%), Triton® H55 nonionic surfactant (0.5%), Tergitol® NP12 surfactant (0.04%), potassium silicate (8.2%) and water, and has a $K_2O$:$SiO_2$ molar ratio of about 1:1.2 and a pH of about 13.5. The percentages are by weight.

MEK represents methyl ethyl ketone.

MSA represents methanesulfonic acid (99%).

NMP represents N-methylpyrrolidone.

PDEA represents N-phenyldiethanolamine

PG represents phloroglucinol.

PM represents 1-methoxy-2-propanol (also known as Dowanol PM).

Ruthapen LB 9900 is a cresol resol resin that was obtained from Hexion AG (Germany).

Ruthapen 0744 LB is a cresol novolak resin that was obtained from Bakelight AG (Germany).

S 0451 is an IR dye ($\lambda_{max}$=775 nm) that was obtained from FEW Chemicals (Germany).

S 0094 is an IR dye ($\lambda_{max}$=813 nm) that was obtained from FEW Chemicals (Germany).

Sudan Black B is a neutral diazo dye (C.U. 26150).

TEA represents triethanolamine.

TETRAKIS-HEEDA represents N,N,N',N'-tetrakis(2-hydroxyethyl)-ethylenediamine.

TETRAKIS-HPEDA represents N,N,N',N'-tetrakis(2-hydroxypropyl)-ethylenediamine.

THPE represents 1,1,1-tris(4-hydroxyphenyl)ethane.

Victoria Blue R is a triarylmethane dye (C.I. 44040).

Polymer A (as defined by Structure I above) was prepared using the following procedure:

BF-03 (50 g) was added to reaction vessel fitted with a water-cooled condenser, a dropping funnel, and thermometer, and containing DMSO (200 g). With continual stirring, the mixture was heated for 30 minutes at 80° C. until it became a clear solution. The temperature was then adjusted at 60° C. and MSA (2.7 g) in DMSO (50 g) was added. Over 15 minutes, a solution of butyraldehyde (10.4 g) was added to the reaction mixture and it was kept for 1 hour at 55-60° C. Then, 2-hydroxybenzaldehyde (salicylic aldehyde, 39 g) in DMSO (100 g) was added to the reaction mixture. The reaction mixture was then diluted with anisole (350 g) and vacuum distillation was started. The anisole:water azeotrope was distilled out from the reaction mixture (less than 0.1% of water remained in the solution). The reaction mixture was chilled to room temperature and was neutralized with TEA (8 g) dissolved in DMSO (30 g), then blended with 6 kg of water. The resulting precipitated polymer was washed with water, filtered, and dried in vacuum for 24 hours at 50° C. to obtain 86 g of dry Polymer A.

Invention Examples 1-4 and Comparative Examples 1 & 2

Imageable elements of the present invention and two Comparative elements outside of this invention (Comparative Example 1 being a "Control") were prepared in the following manner with the radiation-sensitive compositions having the following components:

| | |
|---|---|
| Ruthaphen 744 LB | 7.22 g |
| Crystal Violet | 0.2 g |
| S 0094 IR Dye | 0.16 g |
| Basic nitrogen-containing organic compound (see TABLE I below) | 0.4 g total |
| PM | 91.8 g |

Each formulation was filtered and applied to an electrochemically roughened and anodized aluminum substrate that had been subjected to a treatment with an aqueous solution of poly(vinyl phosphonic acid) by means of common methods and the resulting imageable layer coating was dried for 2.5 minutes at 105° C. in Glunz&Jensen "Unigraph Quartz" oven. The dry coverage of each imageable layer was about 1.5 g/m$^2$.

Each resulting imageable element was exposed on a CREO® Lotem 400 Quantum imager in a range of energies of 40 mJ/cm$^2$ to 200 mJ/cm$^2$ and developed for 30 seconds at 25° C. in a Glunz&Jensen "InterPlater 85HD" processor using the GOLDTAR Premium Developer. The resulting printing plates were evaluated for sensitivity (clearing point: the lowest imaging energy at which the exposed regions were completely removed by the developer at a given temperature and time) and Cyan density loss in the non-exposed areas. The results are shown in TABLE I.

TABLE I

| Element | Acidic Developability-Enhancing Compound (g) | Basic Nitrogen-containing Organic Compound | Boiling Point of Basic Nitrogen-containing Organic Compound | Sensitivity mJ/cm$^2$ (23° C./30 sec.) | Cyan Density Loss (%) |
|---|---|---|---|---|---|
| Comparative 1 | 0 | 0 | — | 160* | 5.7 |
| Comparative 2 | THPE | 0 | m.p. 55° C. | 90 | 4.7 |
| Invention Example 1 | 0 | HEP | >319 | 80 | 4.8 |
| Invention Example 2 | 0 | BIS-TRIS | m.p. 104° C. | 80 | 5.5 |
| Invention Example 3 | THPE** | BIS-TRIS | Not available | 80 | 6.5 |
| Invention Example 4 | THPE*** | HEP | Not available | 80 | 6.2 |

*Element developed at 25° C./40 seconds.
**BIS-TRIS:THPE used at weight ratio of 1:1
***HEP:THPE used at weight ratio of 1:1

The results in TABLE I show that addition of a basic nitrogen-containing organic compound as a developability enhancing compound according to the present invention (Invention Examples 1 and 2) to a novolak-containing radiation-sensitive compositions and imageable layers provided printing plate precursors having high sensitivity when imaged in digital imaging device at 700-1000 nm. In addition, when the elements of this invention were developed in an aqueous alkaline developer, there was acceptable low weight loss in the non-exposed regions.

Moreover, the results in Invention Examples 3 and 4 show that the use of these basic nitrogen-containing organic compounds in combination with an acidic developability-enhancing compound (for example, THPE) in the radiation-sensitive composition and imageable layer provided imageable elements with high sensitivity when imaged in digital imaging device at 700-1000 nm. In addition, when the elements of this invention were developed in an aqueous alkaline developer, there was acceptable low weight loss in the non-exposed regions.

Invention Examples 5-11 and Comparative Example 3

Imageable elements of the present invention and a Comparative element outside of this invention were prepared in the following manner with the radiation-sensitive compositions having the following components:

| | |
|---|---|
| Polymer A | 16.3 g |
| Victoria Blue R | 0.34 g |
| S 0094 IR Dye | 0.48 g |
| Basic nitrogen-containing organic compound (see TABLE II below) | 1.6 g |
| PM | 162.9 g |

Each formulation was filtered and applied to an electrochemically roughened and anodized aluminum substrate that had been subjected to a treatment with an aqueous solution of poly(vinyl phosphonic acid) by means of common methods and the resulting imageable layer coating was dried for 2.5 minutes at 100° C. in Glunz&Jensen "Unigraph Quartz" oven. The dry coverage of each imageable layer was about 1.5 g/m$^2$.

Each resulting imageable element was exposed on a CREO® Lotem 400 Quantum imager in a range of energies of 40 mJ/cm$^2$ to 350 mJ/cm$^2$ and developed for 30 seconds at 25° C. in a Glunz&Jensen "InterPlater 85HD" processor using the L-6 (90 ms) developer. The resulting printing plates were evaluated for sensitivity (clearing point: the lowest imaging energy at which the exposed regions were completely removed by the developer at a given temperature and time) and Cyan density loss in the non-exposed areas. The results are shown in TABLE II.

TABLE II

| Element | Basic nitrogen-containing organic compound | Boiling point (° C.) | Sensitivity mJ/cm$^2$ (25° C./30 sec.) | Cyan Density Loss (%) |
|---|---|---|---|---|
| Comparative 3 | None | — | 350 | 3.3 |
| Invention Example 5 | HEP | 305 | 70 | 6.6 |
| Invention Example 6 | TEA | >319 | 80 (23° C./20 sec.) | 5.1 |
| Invention Example 7 | HEPAPN | 315 | 130 | 2.7 |
| Invention Example 8 | PDEA | m.p. 55° C. | 70 | 3.9 |
| Invention Example 9 | BIS-TRIS | m.p. 104° C. | 80 | 5.3 |
| Invention Example 10 | TETRAKIS-HEEDA | >320 | 80 | 6.2 |
| Invention Example 11 | TETRAKIS-HPEDA | b.p. 190° C. (1 mmHg) | 90 | 4.6 |

The results in TABLE II show that the addition of basic nitrogen-containing organic compounds as developability enhancing compounds according to this invention to radiation-sensitive compositions and imageable layers containing a poly(vinyl acetal) provided imageable elements with high sensitivity when imaged in digital imaging device at 700-1000 nm. In addition, when the imaged elements of this invention were developed in an aqueous alkaline developer, there was acceptable low weight loss in the non-exposed regions.

Invention Examples 12-19 & Comparative Examples 4 & 5

Imageable elements of the present invention and Comparative elements outside of this invention were prepared in the following manner with the radiation-sensitive compositions having the following components:

| | |
|---|---|
| Polymer A | 11 g |
| Crystal Violet | 0.42 g |
| S 0094 IR Dye | 0.17 g |

-continued

| | |
|---|---|
| S 0451 IR Dye | 0.29 g |
| Ruthaphen LB 9900 | 5.0 g |
| Sudan Black B | 0.17 g |
| Basic nitrogen organic compound (see TABLE III below with amounts) | |
| PM | 120 g |
| MEK | 15 g |

Each formulation was filtered and applied to an electrochemically roughened and anodized aluminum substrate that had been subjected to a treatment with an aqueous solution of poly(vinyl phosphonic acid) by means of common methods and the resulting imageable layer coating was dried for 1 minute at 100° C. in Glunz&Jensen "Unigraph Quartz" oven. After the imageable layers were coated, they were heat treated at a temperature of 55° C. and a relative humidity of 25% RH for 3 days. The dry coverage of each imageable layer was about 1.5 g/m$^2$.

Each resulting imageable element was exposed on a CREO® Lotem 400 Quantum imager in a range of energies 40 mJ/cm$^2$ to 150 mJ/cm$^2$ and developed for 30 seconds at 23° C. in a Glunz&Jensen "InterPlater 85HD" processor using the using the L-6 (90 ms) developer. The resulting printing plates were evaluated for sensitivity (clearing point: the lowest imaging energy at which the exposed regions were completely removed by the developer at a given temperature and time) and Cyan Density Loss in the non-exposed areas.

Thereafter, each of the printing plates was mounted on a Heidelberg GTO-52 press to print 200K impressions. The dot % for 1%, 2%, 3%, 5% and 50% dots were measured on the prints every 10K impressions and the plates were judged as excellent if the dot % for the 1% dots was sharpened less than 10%. The results are shown in the following TABLE III.

TABLE III

| Element | Acidic Developability-Enhancing Compound (g) | Basic Nitrogen-containing Organic Compound | Sensitivity mJ/cm$^2$ (23° C./30 sec.) | Cyan Density Loss (%) | Press performance (1000 × copies)* |
|---|---|---|---|---|---|
| Comparative 4 | 0 | 0 | >>150 | 2.3 | >200 |
| Comparative 5 | PG (1.05 g) | 0 | 50 | 6.7 | >200 |
| Invention Example 12 | PG (0.5 g) | HEP (0.5 g) | 40 | 9.8 | >200 |
| Invention Example 13 | THPE (1.0 g) | HEP (0.5 g) | 50 | 4.5 | >200 |
| Invention Example 14 | 0 | HEP (1.5 g) | 40 | 8.6 | >200 |
| Invention Example 15 | 0 | HEP (0.5 g) + TETRAKIS-HPEDA (0.5 g) | 60 | 5.2 | >200 |
| Invention Example 16 | 0 | Bis-Tris (1.05 g) | 50 | 6.2 | 200 |
| Invention Example 17 | 0 | TETRAKIS-HPEDA (1.5 g) | 60 | 4.9 | >200 |
| Invention Example 18 | 0 | TETRAKIS-HPEDA (0.5 g) + Bis-Tris (0.5 g) | 50 | 5.8 | >200 |
| Invention Example 19 | 0 | HEP (0.5 g) + Bis-Tris (0.5 g) | 50 | 5.4 | >200 |

*1% dots changed less than 10%.

The results in TABLE III show that using one or more basic nitrogen-containing organic compounds as developability enhancing compounds according to the present invention in radiation-sensitive compositions and imageable layers containing a poly(vinyl acetal) provided printing plate precursors (imageable elements) having high sensitivity when imaged in digital imaging device at 700-1000 nm. Moreover, upon development, they showed acceptable low weight losses in the not-exposed regions, and provided extremely good durable printing performance.

The results in Invention Examples 12 and 13 also show that the use of at least one of these basic nitrogen-containing organic compounds in combination with an acidic developability-enhancing compound provided improved developing latitude and printing.

The invention has been described in detail with particular reference to certain preferred embodiments thereof, but it will be understood that variations and modifications can be effected within the spirit and scope of the invention.

The invention claimed is:

1. A radiation-sensitive composition comprising:

a. an aqueous alkaline developer soluble polymeric binder that comprises a poly(vinyl acetal), and b. a developability-enhancing composition comprising a basic nitrogen-containing organic compound, wherein said developability-enhancing composition comprises one or more basic nitrogen-containing compounds that are represented by the following Structure (II):

$$(R^7)_s—N—[(CR^8R^9)_t—OH]_v \quad (II)$$

wherein s is 0, 1, or 2 and v is 1 to 3, provided that the sum of s and v is 3, and t is 1 to 6, and when s is 1, $R^7$ is hydrogen or an alkyl, alkylamine, cycloalkyl, heterocycloalkyl, aryl, arylamine, or heteroaryl group, and when s is 2, the multiple $R^7$ groups can be the same or different alkyl, alkylamine, cycloalkyl, heterocycloalkyl, aryl, arylamine, or heteroaryl groups, or the two $R^7$ groups together with the nitrogen atom, can form a substituted or unsubstituted heterocyclic ring, and $R^8$ and $R^9$ are independently hydrogen or an alkyl group, wherein said poly(vinyl acetal) comprises recurring units represented by the following Structure (PVAc):

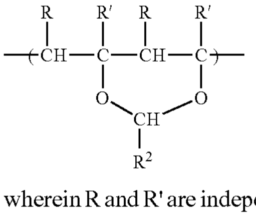

(PVAc)

wherein R and R' are independently hydrogen or an alkyl or halo group, and $R^2$ is a substituted or unsubstituted phenol, naphthol, or anthracenol group.

2. The radiation-sensitive composition of claim 1 further comprising a radiation absorbing compound.

3. The radiation-sensitive composition of claim 1 wherein said polymeric binder comprises a poly(vinyl acetal) that has from about 50 to about 75 mol % recurring acetal-containing units.

4. The radiation-sensitive composition of claim 3 wherein said polymeric binder comprises a poly(vinyl acetal) that is represented by the following Structure (I):

$$-(A)_m-(B)_{n-(C)p}-(D)_q-(E)_r- \quad (I)$$

wherein:

A represents recurring units represented by the following Structure (Ia):

(Ia)

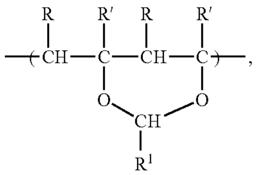

B represents recurring units represented by the following Structure (Ib):

(Ib)

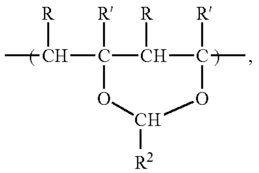

C represents recurring units represented by the following Structure (Ic):

(Ic)

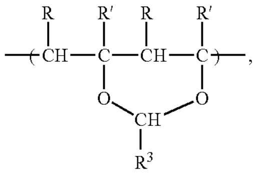

D represents recurring units represented by the following Structure (Id):

(Id)

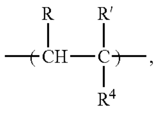

E represents recurring units represented by the following Structure (Ie):

(Ie)

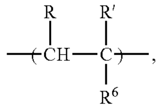

m is from about 5 to about 40 mol %, n is from about 10 to about 60 mol %, p is from 0 to about 20 mol %, q is from about 1 to about 20 mol % and r is from about 5 to about 60 mol %, provided that m+n+p is at least 50 mol %, R and R' are independently hydrogen or an alkyl or halo group, $R^1$ is an alkyl, cycloalkyl, or aryl group other than a phenol or naphthol, $R^2$ is a phenol or naphthol group, $R^3$ is an alkyl group, $R^4$ is an —O—C(═O)—$R^5$ group wherein $R^5$ is an alkyl or aryl group, and $R^6$ is a hydroxy group.

5. The radiation-sensitive composition of claim 4 wherein m is from about 15 to about 35 mol %, n is from about 20 to about 40 mol %, p is from 0 to about 10 mol %, q is from about 1 about 15 mol %, r is from about 15 to about 55 mol %, and s is from about 5 to about 15 mol %.

6. The radiation-sensitive composition of claim 1 wherein t is 2 and $R^8$ and $R^9$ are both hydrogen.

7. The radiation-sensitive composition of claim 1 wherein said developability-enhancing composition comprises one or more of N-(2-hydroxyethyl)-2-pyrrolidone, 1-(2-hydroxyethyl)piperazine, N-phenyldiethanolamine, triethanolamine, 2-[bis(2-hydroxyethyl)amino]-2-hydroxymethyl-1.3-propanediol, N,N,N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1,3,5-tris(2-hydroxyethyl)-s-triazine.

8. The radiation-sensitive composition of claim 1 wherein said one or more basic nitrogen-containing organic compounds are present in an amount of from about 1 to about 30% of the total radiation-sensitive composition solids.

9. The radiation-sensitive composition of claim 1 comprising two or more of said basic nitrogen-containing organic compounds.

10. The radiation-sensitive composition of claim 1 comprising one or more of said basic nitrogen-containing organic compounds and one or more acidic developability-enhancing compounds.

11. The radiation-sensitive composition of claim 1 wherein said basic nitrogen-containing organic compound is a liquid at 25° C., or it has a boiling point greater than 300° C. and an evaporation rate <0.01 relative to n-butyl acetate.

12. A positive-working imageable element comprising a substrate, and having thereon:

an imageable layer comprising an aqueous alkaline developer soluble polymeric binder that comprises a poly (vinyl acetal), a developability-enhancing composition comprising a basic nitrogen-containing compound, and a radiation absorbing compound, wherein said developability-enhancing composition comprises one or more basic nitrogen-containing compounds that are represented by the following Structure (II):

$$(R^7)_s—N—[(CR^8R^9)_t—OH]_v \quad (II)$$

wherein s is 0, 1, or 2 and v is 1 to 3, provided that the sum of s and v is 3, and t is 1 to 6, and when s is 1, $R^7$ is hydrogen or an alkyl, alkylamine, cycloalkyl, heterocycloalkyl, aryl, arylamine, or heteroaryl group, and when s is 2, the multiple $R^7$ groups can be the same or different alkyl, alkylamine, cycloalkyl, heterocycloalkyl, aryl, arylamine, or heteroaryl groups, or the two $R^7$ groups together with the nitrogen atom, can form a substituted or unsubstituted heterocyclic ring, and $R^8$ and $R^9$ are independently hydrogen or an alkyl group.

13. The element of claim 12 wherein said polymeric binder is present at a coverage of from about 30 to about 95 weight %, said developability-enhancing composition is present at a coverage of from about 1 to about 30 weight %, and said radiation absorbing compound is an infrared radiation absorbing compound that is present at a coverage of from about 0.1 to about 20 weight %, all based on the total dry weight of said imageable layer.

14. The element of claim 12 wherein said polymeric binder comprises a poly(vinyl acetal) that comprises recurring units represented by the following Structure (PVAc):

(PVAc)

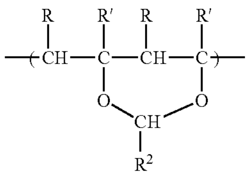

wherein R and R' are independently hydrogen or an alkyl or halo group, and $R^2$ is a substituted or unsubstituted phenol, naphthol, or anthracenol group.

15. The element of claim 12 wherein said polymeric binder comprises a poly(vinyl acetal) that is represented by the following Structure (I):

$$-(A)_m-(B)_n-(C)_p-(D)_q(E)_r- \quad (I)$$

wherein:

A represents recurring units represented by the following Structure (Ia):

(Ia)

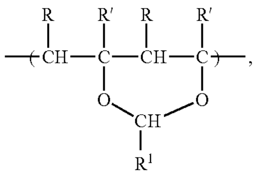

B represents recurring units represented by the following Structure (Ib):

(Ib)

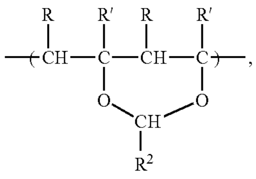

C represents recurring units represented by the following Structure (Ic):

(Ic)

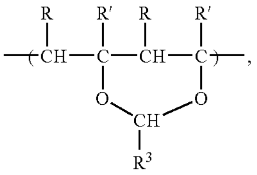

D represents recurring units represented by the following Structure (Id):

(Id)

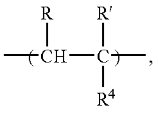

E represents recurring units represented by the following Structure (Ie):

(Ie)

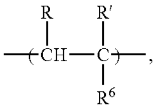

m is from about 5 to about 40 mol %, n is from about 10 to about 60 mol %, p is from 0 to about 20 mol %, q is from about 1 to about 20 mol %, and r is from about 5 to about 60 mol %, provided that m+n+p is at least 50 mol %, R and R' are independently hydrogen or an alkyl or halo group, $R^1$ is an alkyl, cycloalkyl, or aryl group other than a phenol or naphthol, $R^2$ is a phenol or naphthol group, $R^3$ is an alkyl group, $R^4$ is an —O—C(=O)—$R^5$ group wherein $R^5$ is an alkyl or aryl group, and $R^6$ is a hydroxy group.

16. The element of claim 15 wherein t is 2 and $R^8$ and $R^9$ are both hydrogen.

17. The element of claim 12 wherein said developability-enhancing composition comprises one or more of N-(2-hydroxyethyl)-2-pyrrolidone, 1-(2-hydroxyethyl)piperazine, N-phenyldiethanolamine, triethanolamine, 2-[bis(2-hydroxyethyl)amino]-2-hydroxymethyl-1.3-propanediol, N,N,N',N'-tetrakis(2-hydroxyethyl)-ethylenediamine, N,N,N',N'-tetrakis(2-hydroxypropyl)-ethylenediamine, 3-[(2-hydroxyethyl)phenylamino]propionitrile, and hexahydro-1,3,5-tris(2-hydroxyethyl)-s-triazine.

18. The element of claim 12 wherein said basic nitrogen-containing organic compound is a liquid at 25° C., or it has a boiling point greater than 300° C. and an evaporation rate <0.01 relative to n-butyl acetate.

19. The element of claim 12 wherein said developability-enhancing composition comprises one or more of N-(2-hydroxyethyl)-2-pyrrolidone, triethanolamine, and N,N,N',N'-tetrakis(2-hydroxypropyl)-ethylenediamine, in an amount of from about 3 to about 15 weight % based on the total dry weight of said imageable layer.

20. A method of making a printing plate comprising:

A) imagewise exposing the positive-working imageable element of claim 12 to provide exposed and non-exposed regions, and B) developing said imagewise exposed element to remove only said exposed regions.

21. The method of claim 20 wherein said imageable element is imaged at a wavelength of from about 700 to about 1200 nm.

22. The method of claim 20 wherein said imageable element comprises a polymeric binder in said imageable layer that comprises a poly(vinyl acetal) that comprises recurring units represented by the following Structure (PVAc):

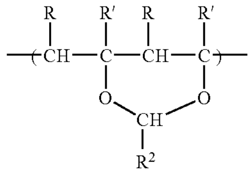

(PVAc)

wherein R and R' are independently hydrogen or an alkyl or halo group, and $R^2$ is a substituted or unsubstituted phenol, naphthol, or anthracenol group, and said developability-enhancing composition comprises one or more basic nitrogen-containing organic compounds that are represented by the following Structure (II):

$$(R^7)_s\text{—N—}[(CR^8R^9)_t\text{—OH}]_v \quad \text{(II)}$$

wherein s is 0, 1, or 2 and v is 1 to 3, provided that the sum of s and v is 3, and t is 1 to 6, and when s is 1, $R^7$ is hydrogen or an alkyl, alkylamine, cycloalkyl, heterocycloalkyl, aryl, arylamine, or heteroaryl group, and when s is 2, the multiple $R^7$ groups can be the same or different alkyl, alkylamine, cycloalkyl, heterocycloalkyl, aryl, arylamine, or heteroaryl groups, or the two $R^7$ groups together with the nitrogen atom, can form a substituted or unsubstituted heterocyclic ring, and $R^8$ and $R^9$ are independently hydrogen or an alkyl group.

* * * * *